(12) United States Patent
Arai

(10) Patent No.: US 9,256,235 B2
(45) Date of Patent: *Feb. 9, 2016

(54) TEMPERATURE CONTROL CIRCUIT AND OVEN CONTROLLED CRYSTAL OSCILLATOR

(71) Applicant: NIHON DEMPA KOGYO CO., LTD., Tokyo (JP)

(72) Inventor: Junichi Arai, Saitama (JP)

(73) Assignee: NIHON DEMPA KOGYO CO., LTD., Tokyo (JP)

( * ) Notice: Subject to any disclaimer, the term of this patent is extended or adjusted under 35 U.S.C. 154(b) by 0 days.

This patent is subject to a terminal disclaimer.

(21) Appl. No.: 14/460,370

(22) Filed: Aug. 15, 2014

(65) Prior Publication Data

US 2015/0084705 A1 Mar. 26, 2015

(30) Foreign Application Priority Data

Sep. 26, 2013 (JP) ................... 2013-200161

(51) Int. Cl.
*H03L 1/04* (2006.01)
*G05F 1/46* (2006.01)
*H03L 1/02* (2006.01)

(52) U.S. Cl.
CPC ............... *G05F 1/463* (2013.01); *H03L 1/028* (2013.01)

(58) Field of Classification Search
CPC .................................. H03L 1/04; H03L 1/028
USPC .......... 331/107 R, 116 R, 154, 158, 176, 185, 331/186, 70
See application file for complete search history.

(56) References Cited

U.S. PATENT DOCUMENTS

| 2010/0052801 | A1* | 3/2010 | Koyama et al. | 331/69 |
| 2010/0289589 | A1* | 11/2010 | Ito et al. | 331/70 |
| 2013/0008883 | A1* | 1/2013 | Arai | 219/210 |

FOREIGN PATENT DOCUMENTS

| JP | 2012-134910 | 7/2012 |
| JP | 2013-038765 | 2/2013 |

* cited by examiner

*Primary Examiner* — Jeffrey Shin
(74) *Attorney, Agent, or Firm* — Jianq Chyun IP Office

(57) ABSTRACT

A temperature control circuit of an oven controlled crystal oscillator is a circuit in which a supply voltage is applied to a first terminal of a resistance R10, a first terminal of a resistance R11, and a first terminal of a heater resistance RH1, a second terminal of a thermistor TH1, a second terminal of a temperature sensing element, and a collector side of a transistor Q2 are connected to a common ground, a first terminal of a temperature sensing element ZZ is connected to an input terminal of an operational amplifier IC2, and a setting temperature in a thermostatic oven is controlled to gradually rise as an ambient operative temperature rises.

7 Claims, 7 Drawing Sheets

TEMPERATURE CONTROL CIRCUIT AND OVEN CONTROLLED CRYSTAL OSCILLATOR

CROSS-REFERENCE TO RELATED APPLICATIONS

This application claims the priority benefit of Japan application serial no. 2013-200161, filed on Sep. 26, 2013. The entirety of the above-mentioned patent application is hereby incorporated by reference herein and made a part of this specification.

TECHNICAL FIELD

The present disclosure relates to a temperature control circuit of an oven controlled crystal oscillator, especially to the temperature control circuit and the oven controlled crystal oscillator capable of controlling a temperature in a broad operative temperature range using a crystal resonator having high stability.

BACKGROUND OF THE INVENTION

Description of the Related Art

An oven controlled crystal oscillator (OCXO) is a crystal oscillator provided with a temperature tank that maintains a constant temperature. In the OCXO, an AT-cut crystal resonator or an SC-cut crystal resonator whose temperature characteristics are expressed by a cubic curve is used. In the OCXO, a temperature is controlled in a portion where a frequency is the most stable in a temperature characteristics curve.

An operative temperature of the OCXO is roughly 0° C. to +70° C. in general. Since the OCXO has only a mechanism for heating a heat source, the temperature of the heat source is controlled at a high temperature such as +80° C. Although it depends on a configuration, a temperature difference of 7° C. to 10° C. is required between the operative temperature and the heat source in general, and when a control temperature in the OCXO approaches the operative temperature closer, an internal temperature becomes out of control.

Because a high temperature is maintained in the temperature tank, reliabilities of internal components such as a resistance, a capacitor, and a semiconductor must be always considered. Especially, as the temperature rises, a long-term reliability deteriorates faster and a component lifetime becomes shorter. According to the Arrhenius' equation that is generally used, it is known that the lifetime reduces to a half when the temperature rises 10° C.

On the other hand, the temperature characteristics of the SC-cut crystal resonator, which is mainly used for the OCXO, are expressed by the cubic curve having a point of inflection at ±95° C. The highest point where the frequency is the most stable has a variation of about 10° C. in practice (for example, +80° C. ±5° C.). The cause of this variation is manufacturing variations due to a cutting accuracy in cutting a crystal.

As the point of inflection gets closer to the highest point, which means the temperature difference between the highest point and the point of inflection gets smaller, the variation becomes larger to cause to deteriorate a yield of the SC-cut crystal resonator.

In recent years, a market requires the OCXO having a broad operative temperature range. The OCXO having the operative temperature range of 0° C. to +70° C. have been required thus far but the OCXO having the operative temperature range of −40° C. to +85° C. tends to be required currently. This is because a size of a cooling function is minimized to save energy in an apparatus and the apparatus is assumed to be placed outdoors.

Therefore, as described above, an operating point of a thermostatic oven tends to be high. For example, when a setting temperature is set to be +85° C., an operating point of a thermostatic oven is +92° C., which is 7° C. higher than the setting temperature, and when the manufacturing variations are added to it, it is +92° C. ±5° C. Therefore, when a +87° C. crystal resonator of a lower temperature side is employed, the temperature differs only +2° C. from the highest point of +85° C., and the operating point of a thermostatic oven becomes out of control.

On the other hand, when a +97° C. crystal resonator of higher temperature side is employed, the operating point of a thermostatic oven is close to the point of inflection +95° C. and exceeds the processing accuracy, and results in being impossible to be manufactured. Further, the temperature in the thermostatic oven gets higher to cause a deterioration of the reliability.

[Temperature Characteristics Curve of the Crystal Resonator: FIGS. 4A-4C]

The temperature characteristics curves of the SC-cut crystal resonator, the IT-cut crystal resonator, and the AT-cut crystal resonator are explained by referring to FIGS. 4A-4C. FIGS. 4A-4C show the temperature characteristics curves of the SC-cut crystal resonator, the IT-cut crystal resonator, and the AT-cut crystal resonator. The SC-cut crystal resonator has its point of inflection at +95° C. as shown in FIG. 4A, the IT-cut crystal resonator has its point of inflection at +75° C. as shown in FIG. 4B, and the AT-cut crystal resonator has its point of inflection at +25° C. as shown in FIG. 4C.

In order to meet the requirements of the operative temperature range of −40° C. to +85° C., especially to meet the requirements of the upper limit temperature of +85° C., it is difficult to employ the SC-cut crystal resonator which is the most stable among the above described crystal resonators, and the IT-cut crystal resonator having the point of inflection at +75° C. or the AT-cut crystal resonator having less stability has to be employed.

[Conventional thermostatic oven temperature control circuit: FIG. 5]

A conventional thermostatic oven temperature control circuit is explained by referring to FIG. 5. FIG. 5 is a circuit diagram of the conventional thermostatic oven temperature control circuit. As shown in FIG. 5, in the conventional thermostatic oven temperature control circuit, a supply voltage Vcc is applied to the first terminals of a thermistor (NTC) TH1, a resistance R11, and a heater resistance RH1, and is also provided to an operational amplifier IC2.

A first terminal of a resistance R10 is connected to a second terminal of the thermistor TH1, and the second terminal of R10 is connected to the ground. The first terminal of a resistance R12 is connected to the second terminal of the resistance R11 and the second terminal of R12 is connected to the ground. A line which connects the second terminal of the thermistor TH1 and the first terminal of the resistance R10 branches, and is connected to a negative input terminal of the operational amplifier IC2 through a resistance R13. The line which connects the second terminal of the resistance R11 and the first terminal of the resistance R12 branches, and is connected to a positive input terminal of the operational amplifier IC2 through a resistance R14.

An output of the operational amplifier IC2 is inputted to a base of a transistor Q2 through a resistance R16 and is also inputted to the operational amplifier IC2 by feeding the output back to the negative input terminal through a resistance R15. The operational amplifier IC2 has a ground terminal that is connected to the ground. The second terminal of the heater resistance RH1 is connected to a collector of the transistor Q2, and an emitter of the transistor Q2 is connected to the ground.

[The temperature characteristics of the conventional thermostatic oven temperature control circuit: FIG. 6]

The temperature characteristics of the conventional thermostatic oven temperature control circuit are explained by referring to FIG. 6. FIG. 6 shows the temperature characteristics of the conventional thermostatic oven temperature control circuit. FIG. 6 shows an electric power of a heater resistance, the electric power of a transistor (a power transistor), and a total electric power that is the sum of those electric powers. As shown in FIG. 6, a control temperature range is from 7° C. to 10° C. within the range of 83° C. to 94° C.

[Conventional setting temperature: FIG. 7]

A conventional setting temperature is explained by referring to FIG. 7. FIG. 7 shows an ambient operative temperature and a thermostatic oven setting temperature. As shown in FIG. 7, the setting temperature of the thermostatic oven becomes the highest when the ambient operative temperature is, for example, 5° C., 25° C., and 75° C., and each peak of the setting temperatures is set to be constant, which is 80° C.

Japanese Unexamined Patent Application Publication No. 2012-134910, "Temperature Control Circuit, Thermostatic Oven Type Piezoelectric Oscillator, Electronic Equipment, and Temperature Control Method" by Seiko Epson Corporation (Patent document 1); and Japanese Unexamined Patent Application Publication No. 2013-038765, "Temperature Control Circuit for Oven-Controlled Crystal Oscillator" by Nihon Dempa Kogyo Co., Ltd. (Patent document 2), each disclose related art.

Patent Document 1 discloses a temperature control circuit, in which a calorific value of a power transistor is controlled by using a first temperature sensing element, a second temperature sensing element, and a third temperature sensing element, and especially, as the temperature detected by the second temperature sensing element is lower, a differential amplifier raises a ratio of a control, and as the temperature detected by the third temperature sensing element is higher, the differential amplifier raises the ratio of control.

Patent Document 2 discloses a configuration that connects a collector side and a thermistor side of a PNP-type power transistor to a ground level using a metal common pattern in a temperature control circuit of an OCXO.

However, the conventional temperature control circuit of the OCXO has a problem of difficulty in employing the SC-cut crystal resonator having high stability in order to meet a requirement to widen the operative temperature range of the OCXO.

In Patent Document 1, the first, the second, and the third temperature sensing elements are used to correct the temperature characteristics. The thermostatic oven setting temperature is not controlled to gradually rise as the ambient operative temperature rises in the Patent Documents 1 and 2.

SUMMARY

The present disclosure is created in view of the aforementioned circumstances, and the present disclosure is to provide the temperature control circuit and the OCXO which can control the temperature in the broad operative temperature range using a crystal resonator having high stability.

The present disclosure which is to solve the problem of the above conventional example is a temperature control circuit of an oven controlled crystal oscillator which comprises an operational amplifier, and a PNP-type transistor, wherein a supply voltage is applied to a first terminal of a first resistance, a first terminal of a second resistance, and a first terminal of a heater resistance, a second terminal of the first resistance is connected to a first terminal of a thermistor and a second terminal of the thermistor is connected to the ground, the second terminal of the second resistance is connected to the first terminal of a temperature sensing element and the second terminal of the temperature sensing element is connected to the ground, a connection point between the second terminal of the first resistance and the first terminal of the thermistor is connected to a first input terminal of the operational amplifier through a third resistance, the connection point between the second terminal of the second resistance and the first terminal of the temperature sensing element is connected to a second input terminal of the operational amplifier through a fourth resistance, an output of the operational amplifier is inputted to the first input terminals by feeding the output back through a fifth resistance and is also inputted to a base of the transistor through a sixth resistance, the second terminal of the heater resistance is connected to an emitter of the transistor, a collector of the transistor is connected to the ground, each part connected to the ground is connected to a ground-common wire, and the temperature sensing element controls a setting temperature in a thermostatic oven to rise as an ambient operative temperature rises.

DESCRIPTION OF EXEMPLARY EMBODIMENTS

The embodiment of the present disclosure is explained by referring to figures.

OUTLINE OF EXEMPLARY EMBODIMENTS

The temperature control circuit according to the present embodiment of this disclosure is a circuit in which the second terminal of the thermistor, the second terminal of the temperature sensing element, and the collector side of the transistor are connected to a common ground, and the temperature sensing element is connected to the input terminal of the operational amplifier to control the thermostatic oven setting temperature to gradually rise as the ambient operative temperature rises. Because the temperature control circuit is a ground-common-type, the SC-cut crystal resonator having high stability can be employed by narrowing the control temperature range than a conventional one and by gradually increasing the thermostatic oven setting temperature as the ambient temperature rises, and the temperature can be controlled in the broad operative temperature range using the crystal resonator having high stability.

Figure 1:
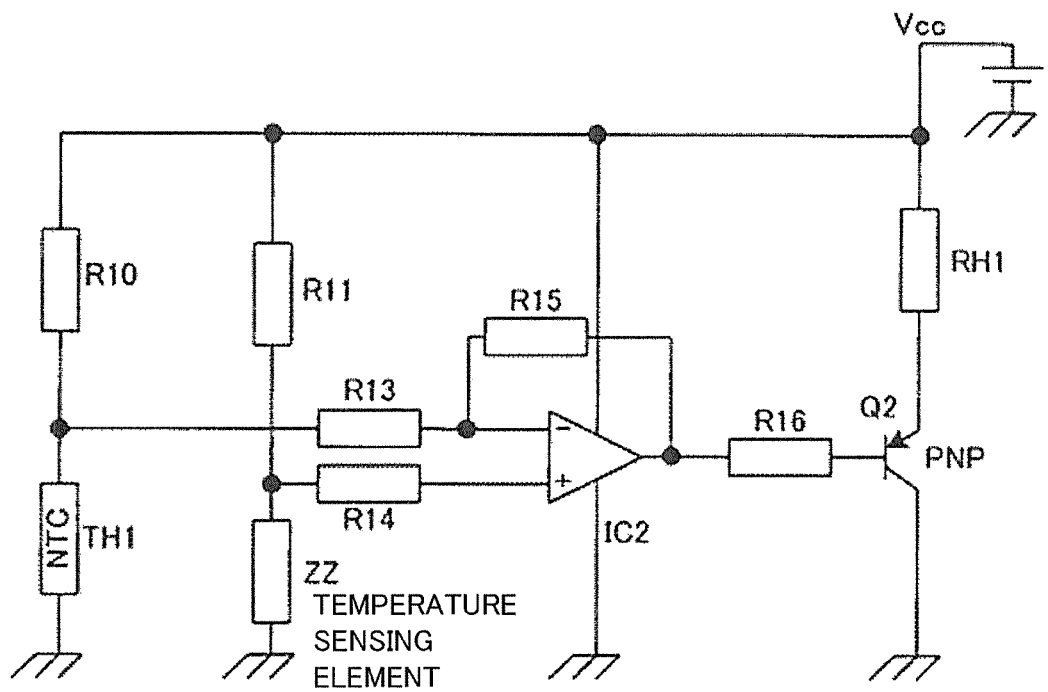
FIG. 1 shows a circuit diagram of a thermostatic oven temperature control circuit according to an exemplary embodiment of the present disclosure.

[The present temperature control circuit: FIG. 1]

The thermostatic oven temperature control circuit according to the present embodiment of the present disclosure (the present temperature control circuit) is explained by referring to FIG. 1. FIG. 1 is a circuit diagram of the thermostatic oven temperature control circuit according the present embodiment of the present disclosure. As shown in FIG. 1, the present temperature control circuit is the ground (GND)-common-type thermostatic oven temperature control circuit, and the supply voltage Vcc is applied to the first terminals of a resistance R10, a resistance R11, and a heater resistance RH1, and is also provided to an operational amplifier IC2.

A first terminal of a thermistor (NTC) TH1 is connected to a second terminal of the resistance R10 and the second terminal is connected to the ground, and the first terminal of a temperature sensing element ZZ is connected to the second terminal of the resistance R11 and the second terminal is connected to the ground. A line which connects the second terminal of the resistance R10 and the first terminal of the thermistor TH1 branches, and is connected to a negative input terminal of the operational amplifier IC2 through a resistance R13, and the line which connects the second terminal of the resistance R11 and the first terminal of the temperature sensing element ZZ branches, and is connected to a positive input terminal of the operational amplifier IC2 through the resistance R14.

An output of the operational amplifier IC2 is inputted to a base of a transistor Q2 through a resistance R16 and is also inputted to the operational amplifier IC2 by feeding the output back to the negative input terminal through the resistance R15. The operational amplifier IC2 has a ground terminal that is connected to the ground. The transistor Q2 is a PNP-type power transistor (may also is a Field-Effect Transistor, such as a Metal-Oxide-Semiconductor Field-Effect Transistor (MOSFET)) and the second terminal of the heater resistance RH1 is connected to the emitter, and the collector of the transistor Q2 is connected to the ground. When the transistor Q2 is the MOSFET, the transistor Q2 is a P-channel (Pch) MOSFET and the base corresponds to a gate, the collector corresponds to a drain, and the emitter corresponds to a source.

The temperature control circuit in FIG. 1 is the GND-common-type temperature control circuit in which the second terminal of the thermistor TH1, the second terminal of the temperature sensing element ZZ, and the collector of the transistor Q2 are connected to a common ground wire.

Further, a first resistance in Claims corresponds to the resistance R10, a second resistance in Claims corresponds to the resistance R11, a third resistance in Claims corresponds to the resistance R13, a fourth resistance in Claims corresponds to the resistance R14, a fifth resistance in Claims corresponds to the resistance R15, and a sixth resistance in Claims corresponds to the resistance R16.

Figure 2:
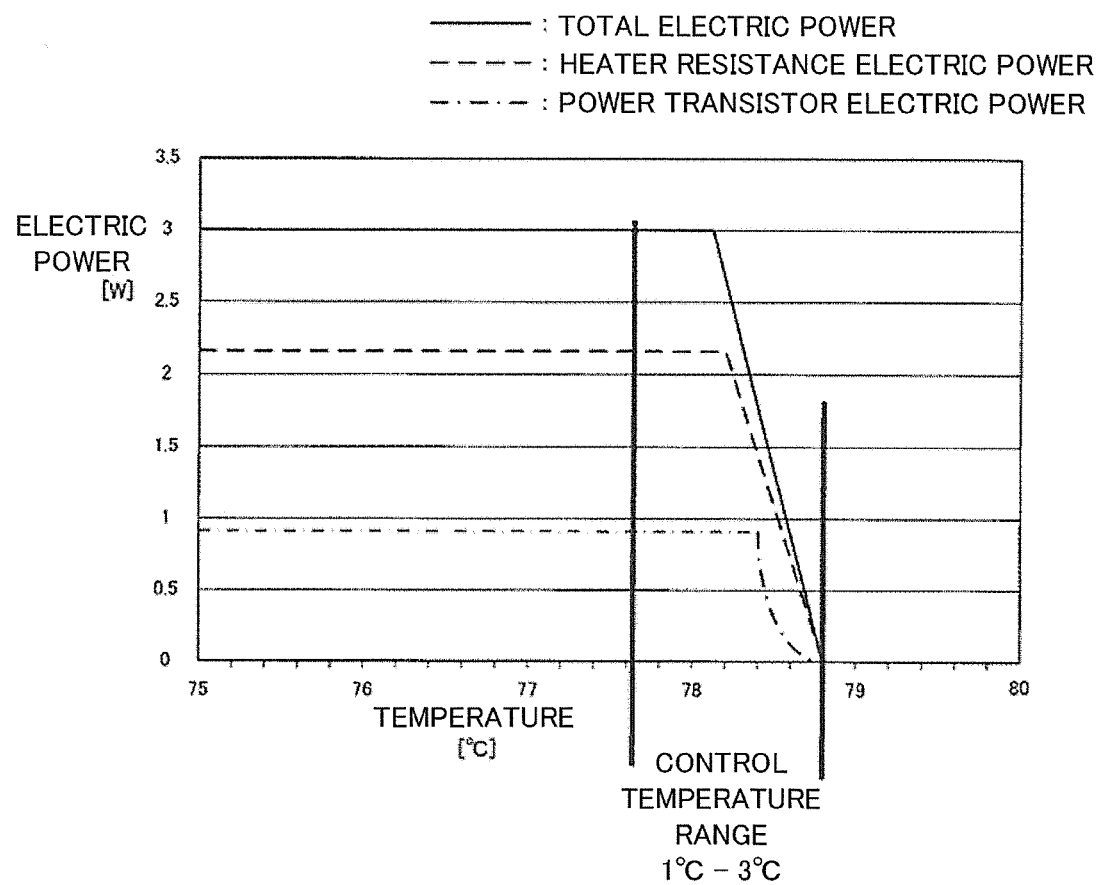
FIG. 2 shows temperature characteristics in the temperature control circuit.

[The GND-common-type temperature control circuit: FIG. 2]

Figure 6:
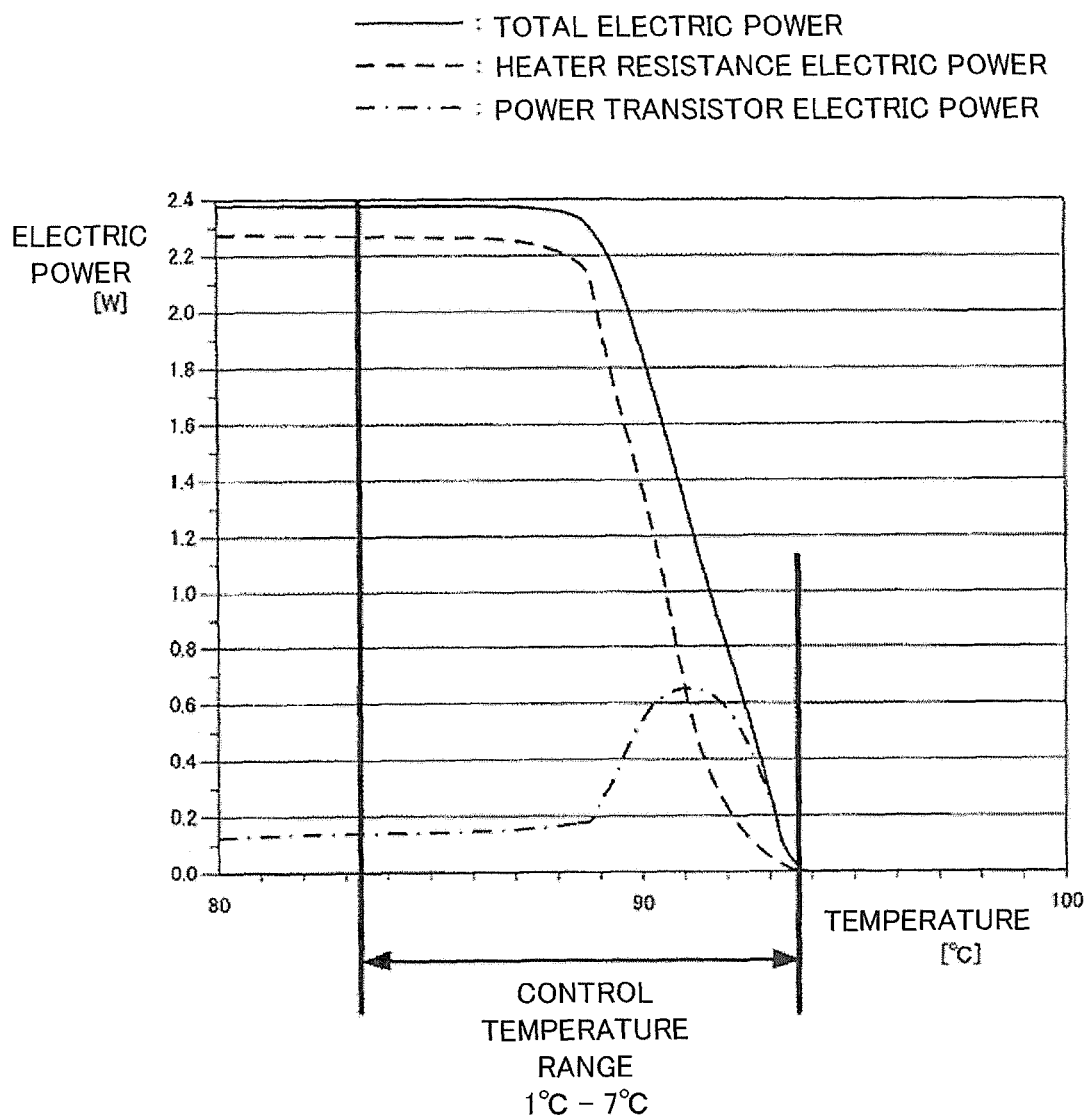
FIG. 6 shows the temperature characteristics in the conventional thermostatic oven temperature control circuit.
Figure 7:
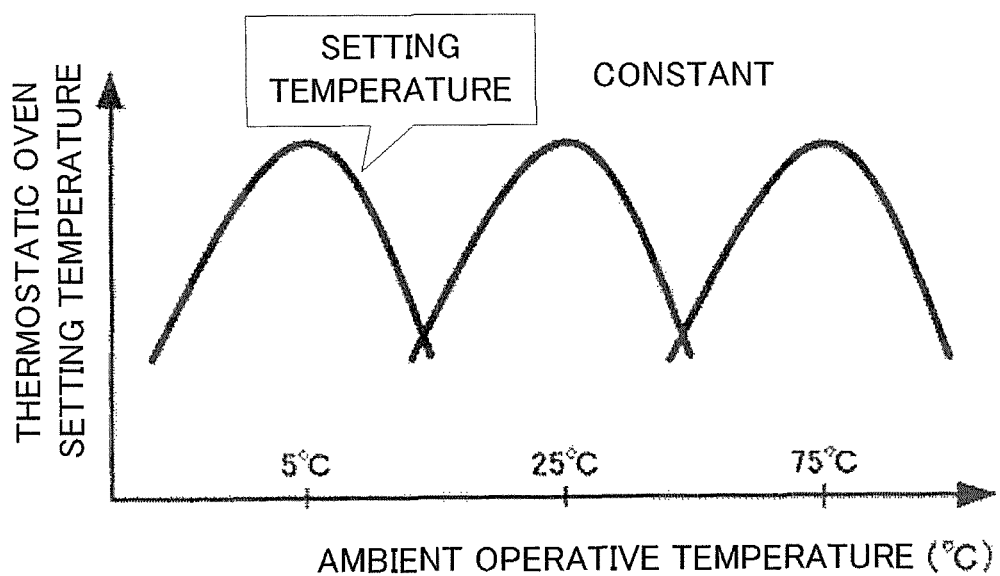
FIG. 7 shows the ambient operative temperature and the thermostatic oven setting temperature.

The temperature characteristics of the GND-common-type thermostatic oven temperature control circuit of the present temperature control circuit are explained by referring to FIG. 2. FIG. 2 shows the temperature characteristics of the present temperature control circuit. FIG. 2 shows an electric power of a heater resistance, the electric power of a transistor (a power transistor), and a total electric power that is a sum of those electric powers. In an example disclosed in FIG. 2, the control temperature range, which is about 2° C. (1° C. to 3° C.), is narrower than the range, which is from 7° C. to 10° C., in a conventional example disclosed in FIG. 6.

By employing the GND-common-type, a thermal responsiveness becomes excellent because a copper pattern can be used for a GND-common-wire to make a thermal resistance smaller than the conventional one. Therefore, a gain control of the thermostatic oven can be made large, the control temperature range can be made small, and the smallest control temperature difference can be made small.

[The temperature sensing element]

The temperature sensing element ZZ in FIG. 1 is formed by a resistance network using a linear positive temperature coefficient resistance and a thermistor. Especially, the temperature sensing element ZZ is preferred to be the linear positive temperature coefficient resistance. The temperature sensing element ZZ is installed close to the outside atmosphere, the resistance is changed by the influence of the outside atmosphere, and is inputted to the positive input terminal of the operational amplifier IC2 through the resistance R14.

The characteristics of the temperature sensing element ZZ show that the resistance value of the temperature sensing element ZZ rises, a voltage of a first terminal side of the temperature sensing element ZZ connected to the resistance R14 rises, and the voltage value which is inputted to the positive input terminal of the operational amplifier IC2 rises as the ambient temperature rises. That is, as the ambient temperature rises, the thermostatic oven setting temperature rises. Therefore, the OCXO operates even if the thermostatic oven setting temperature is not made to be equal to the upper limit of the operative temperature, which is, for example, +7° C. Because the operative point rises as the ambient temperature rises, a control action continues.

Figure 3:
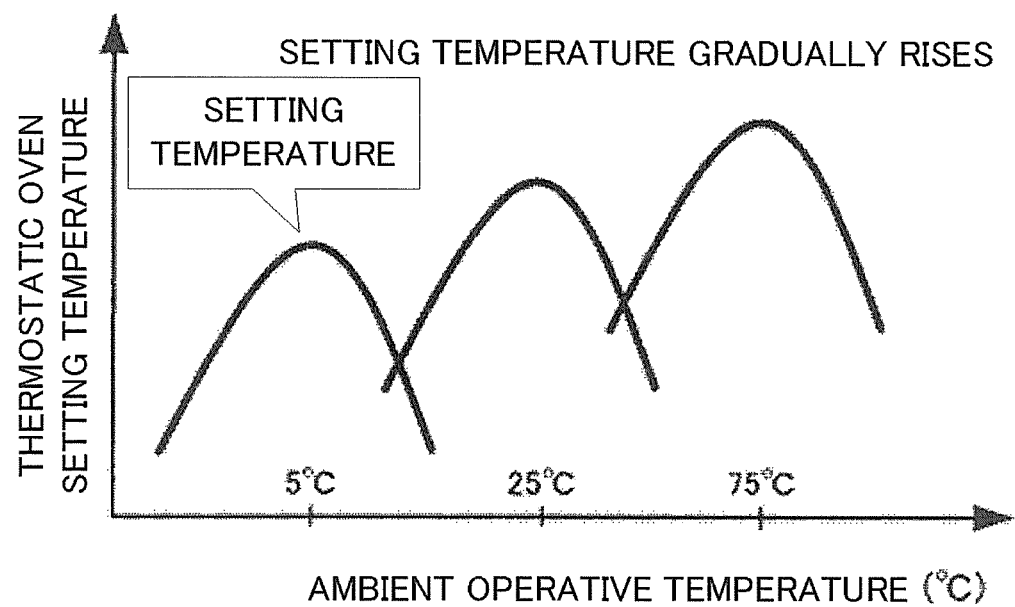
FIG. 3 shows an ambient operative temperature and a thermostatic oven setting temperature of the temperature control circuit.
Figure 4:
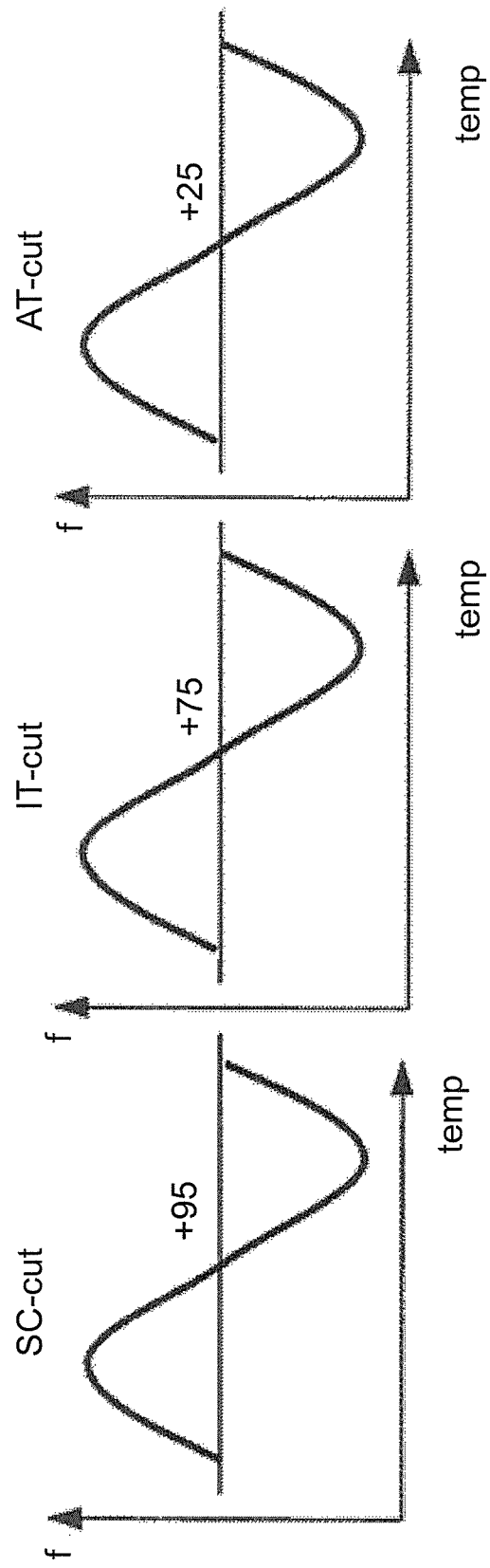
FIGS. 4A-4C show the temperature characteristics of an SC-cut crystal resonator, an IC-cut crystal resonator, and an AT-cut crystal resonator.
Figure 5:
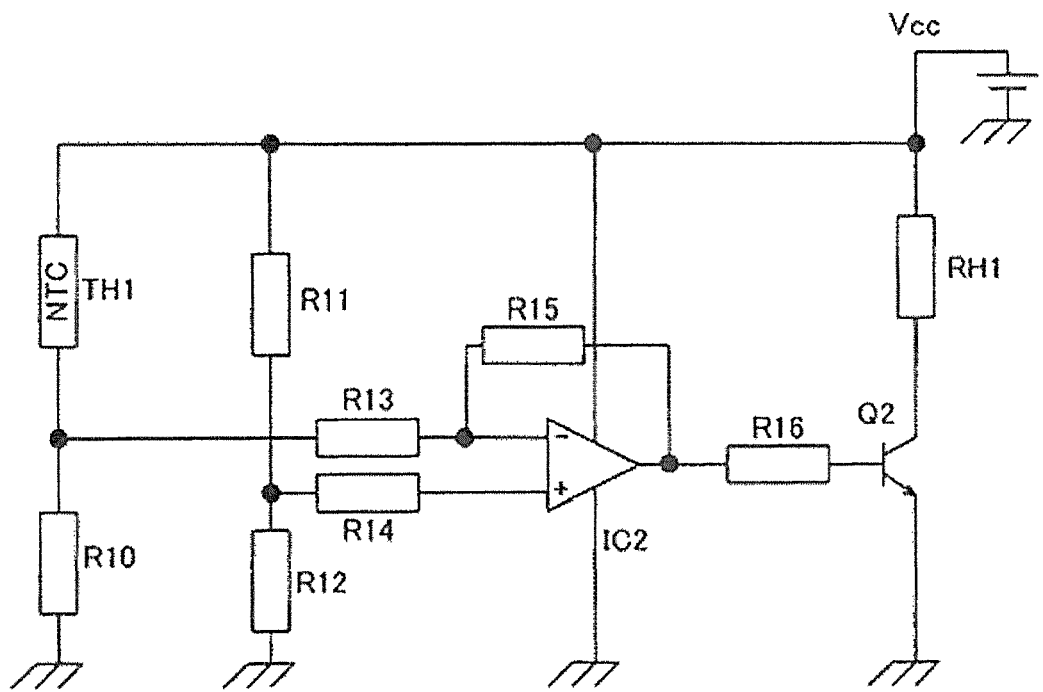
FIG. 5 shows a circuit diagram of a conventional thermostatic oven temperature control circuit.

[The setting temperature of the present temperature control circuit: FIG. 3]

The setting temperature of the present temperature control circuit is explained by referring to FIG. 3. FIG. 3 shows a relationship between the ambient operative temperature of the present temperature control circuit and the thermostatic oven setting temperature. As shown in FIG. 3, in the present temperature control circuit, the setting temperature of the thermostatic oven is set to gradually (in a stepwise manner) rise by 2° C. such as 84° C., 86° C., and 88° C. when the ambient temperature is, for example, 5° C., 25° C., and 75° C.

The setting temperature of 86° C. is a value of the peak, and the setting temperatures of 84° C. and 88° C. are control points shifted from the peak. The control points are shifted because the temperature sensing element is provided. Even when the control points are shifted, there are few problems because the control temperature can be shifted by a range of about 2° C. (1° C. to 3° C.) by employing more stable GND-common-type temperature control circuit. Thus, a control of the thermostatic oven setting temperature to rise gradually with respect to the ambient operative temperature lowers stability, but the stability can be complemented by employing the GND-common-type control whose value of the thermal resistance is low.

For example, when there is an oscillator whose operative temperature range is from 0° C. to +70° C., the setting temperature can be set to be +70° C. If the OCXO is used at +25° C. at a market for instance, the OCXO can be controlled at +70° C., which has been conventionally set the temperature at 80° C. A lifetime is doubled according to the Arrhenius' equation, and a product having a long-term high reliability can be realized. This can be applied when the upper limit of the operative temperature is +85° C. or higher.

When the SC-cut crystal resonator is employed, a practical upper limit of the operative temperature is +70° C., but in the present temperature control circuit, the upper limit can be raised by +85° C. even when the SC-cut crystal resonator is used. That is, when the SC-cut crystal resonator is employed, the highest point where the frequency is the most stable is at 80° C. ±5° C., and when the control temperature range of 2° C. is added to the upper limit of the setting temperature of 85° C., the operative temperature is 87° C., and if the manufacturing variations are further added to it, the operative temperature is 87° C. ±5° C.

Because the present temperature control circuit is the GND-common-type, the temperature can be controlled within a range of 2° C. and the operative temperature can be controlled within 87° C. ±5° C. because the setting temperature in the thermostatic oven is set to gradually rise with respect to the ambient operative temperature.

A crystal resonator has a parameter called "capacity ratio" as one of its characteristics. When the capacity ratio is high, a fluctuation of the frequency depending on a circuit is small, and when the capacity ratio is low, the fluctuation is large. In general, the SC-cut crystal resonator has a high capacity ratio and is hardly affected by a circuit fluctuation, and an OCXO having high stability can be realized. On the other hand, the frequencies of the IT-cut crystal resonator and the AT-cut crystal resonator having a low capacity ratio can be easily changed, but their stabilities are lower than the stability of the SC-cut crystal resonator.

Effects of the Embodiments

In the present temperature control circuit, the second terminal of the thermistor TH1, the second terminal of the temperature sensing element ZZ, and the collector side of the transistor Q2 are connected to a common ground, and the temperature sensing element ZZ is connected to the input terminal of the operational amplifier IC2 to control the thermostatic oven setting temperature to gradually rise as the ambient operative temperature rises. Because the temperature control circuit is a ground-common-type, the SC-cut crystal resonator having high stability can be employed by narrowing the control temperature range and by gradually increasing the thermostatic oven setting temperature as the ambient temperature rises, and the temperature can be controlled in the broad operative temperature range using the crystal resonator having high stability.

Since the OCXO provided with the present temperature control circuit can control the temperature in the broad operative temperature range using the crystal resonator having high stability, a stable oscillator can be realized.

What is claimed is:

1. A temperature control circuit of an oven controlled crystal oscillator, comprising:
    an operational amplifier; and
    a PNP-type transistor, wherein
    a supply voltage is applied to a first terminal of a first resistance, a first terminal of a second resistance, and a first terminal of a heater resistance,
    a second terminal of the first resistance is connected to a first terminal of a thermistor and a second terminal of the thermistor is connected to a ground,
    a second terminal of the second resistance is connected to a first terminal of a temperature sensing element and a second terminal of the temperature sensing element is connected to the ground,
    a connection point between the second terminal of the first resistance and the first terminal of the thermistor is connected to a first input terminal of the operational amplifier through a third resistance,
    a connection point between the second terminal of the second resistance and the first terminal of the temperature sensing element is connected to a second input terminal of the operational amplifier through a fourth resistance,
    an output of the operational amplifier is inputted to the first input terminal by feeding the output back through a fifth resistance and also inputted to a base of the transistor through a sixth resistance,
    a second terminal of the heater resistance is connected to an emitter of the transistor,
    a collector of the transistor is connected to the ground,
    each of the parts connected to the ground is connected to a ground-common wire, and
    the temperature sensing element controls a setting temperature in a thermostatic oven to rise as an ambient operative temperature rises.

2. The temperature control circuit according to claim 1, wherein
    the temperature sensing element controls the setting temperature in the thermostatic oven to rise gradually as the ambient operative temperature rises.

3. The temperature control circuit according to claim 1, wherein
    the temperature sensing element uses a linear positive temperature coefficient resistance.

4. The temperature control circuit according to claim 1, wherein
    the temperature sensing element uses the thermistor.

5. The temperature control circuit according to claim 1, wherein
    a ground-common wire is formed by a copper pattern.

6. The temperature control circuit according to claim 1, wherein
    a Field-Effect Transistor (FET) is used instead of a PNP-type transistor.

7. An oven controlled crystal oscillator, comprising:
    the temperature control circuit according to claim 1,
    wherein an SC-cut crystal resonator is employed for a crystal resonator.

* * * * *